(12) United States Patent
Zhao

(10) Patent No.: US 10,068,542 B2
(45) Date of Patent: Sep. 4, 2018

(54) GATE DRIVER ON ARRAY CIRCUIT AND LIQUID CRYSTAL DISPLAY USING THE SAME

(71) Applicant: WUHAN CHINA STAR OPTOELECTRONICS TECHNOLOGY CO., LTD., Wuhan, Hubei (CN)

(72) Inventor: Mang Zhao, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 273 days.

(21) Appl. No.: 14/916,261

(22) PCT Filed: Feb. 24, 2016

(86) PCT No.: PCT/CN2016/074462
§ 371 (c)(1),
(2) Date: Mar. 3, 2016

(87) PCT Pub. No.: WO2017/117845
PCT Pub. Date: Jul. 13, 2017

(65) Prior Publication Data
US 2018/0046048 A1    Feb. 15, 2018

(30) Foreign Application Priority Data

Jan. 7, 2016    (CN) .......................... 2016 1 0007999

(51) Int. Cl.
G09G 3/36    (2006.01)
G02F 1/1362    (2006.01)
(Continued)

(52) U.S. Cl.
CPC ..... *G09G 3/3674* (2013.01); *G02F 1/136286* (2013.01); *G09G 3/3648* (2013.01);
(Continued)

(58) Field of Classification Search
CPC ......... G11C 19/28; G11C 27/024; G11C 8/04; G09G 2310/0286; G09G 3/3677; G09G 2300/0408; G09G 3/3674
See application file for complete search history.

(56) References Cited

U.S. PATENT DOCUMENTS 8,558,586 B1 * 10/2013 Martin ................. G11C 7/1057
327/108
2006/0007085 A1 *  1/2006 Kim ..................... G09G 3/3677
345/87

(Continued)

*Primary Examiner* — Sanjiv D Patel
(74) *Attorney, Agent, or Firm* — Sughrue Mion, PLLC

(57) ABSTRACT

A GOA circuit includes GOA circuit units. A holding module is substituted for a capacitor in each GOA circuit unit. A second transistor in the holding module is turned on when a scanning signal does not produce a pulse so that voltage imposed in a first control node is held by a first transistor and a third transistor. Because the transistors form a passage between the first control node and a first constant voltage, the voltage imposed on the first control node does not vary due to electricity leakage. Because a second capacitor is coupled with the first control node, the pulse of the scanning signal output by the GOA circuit unit reaches to an ideal high voltage level. The GOA circuit unit can resolve the problem of easy leakage of electricity. When the scanning signals are output by the GOA circuit unit, the stability is highly ensured.

12 Claims, 5 Drawing Sheets

(51) Int. Cl.
*H01L 27/12* (2006.01)
*G11C 19/28* (2006.01)

(52) U.S. Cl.
CPC ......... *G09G 3/3677* (2013.01); *G09G 3/3696* (2013.01); *G11C 19/28* (2013.01); *H01L 27/124* (2013.01); *H01L 27/1255* (2013.01); *G09G 2300/0408* (2013.01); *G09G 2310/0283* (2013.01); *G09G 2310/0286* (2013.01)

(56) References Cited

U.S. PATENT DOCUMENTS

| | | | | |
|---|---|---|---|---|
| 2014/0093028 | A1* | 4/2014 | Wu | G11C 19/28 |
| | | | | 377/64 |
| 2014/0169518 | A1* | 6/2014 | Kong | G09G 3/3674 |
| | | | | 377/64 |
| 2014/0192039 | A1* | 7/2014 | Wang | G11C 19/28 |
| | | | | 345/213 |
| 2015/0228240 | A1* | 8/2015 | Ahn | H03K 17/284 |
| | | | | 345/213 |
| 2016/0268004 | A1* | 9/2016 | Li | G11C 19/28 |
| 2016/0372063 | A1* | 12/2016 | Li | G11C 19/28 |
| 2017/0186393 | A1* | 6/2017 | Wang | G09G 3/3677 |
| 2017/0236482 | A1* | 8/2017 | Ochiai | G09G 3/3677 |
| | | | | 345/212 |

* cited by examiner

GATE DRIVER ON ARRAY CIRCUIT AND LIQUID CRYSTAL DISPLAY USING THE SAME

BACKGROUND OF THE INVENTION

1. Field of the Invention

The present invention relates to a liquid crystal display (LCD), and more particularly, to an LCD using a gate driver on array (GOA) circuit.

2. Description of the Prior Art

The technique to a GOA circuit is that a gate driver is fabricated on a substrate comprising a thin film transistor (TFT) array using the TFT-LCD array process for realizing the driving method of row-by-row scanning.

The GOA circuit comprises a plurality of GOA circuit units. A conventional GOA circuit unit is used for outputting a scanning signal by controlling the output of a gate voltage of the transistor (i.e., a Q node voltage). To ensure that the output transistor exactly conducts a signal pulse at high voltage level to a source from a drain for forming a pulse of a scanning signal, the conventional method is that the output transistor is precharged so that the Q node voltage is charged to a high voltage level before the output transistor conducts the signal at high voltage level. To keep the Q node voltage at high voltage level for at least a pulse of two hours, the conventional technology adopts a capacitor which stores the Q node voltage. The capacitor is electrically connected to other transistors in the GOA circuit unit at this time, so the charge stored in the capacitor tends to leak from other transistors. At last, leakage of electricity occurs. As a result, the Q node voltage is lowered, which causes the output transistor to fail to be turned on completely. Further, the output transistor fails to conduct the signal at high voltage level completely, and then an incomplete scanning signal pulse is formed.

Therefore, it is necessary to improve the conventional method of depositing the voltage at the Q node to the capacitor to prevent the leakage of electricity at the Q node.

SUMMARY OF THE INVENTION

In light of the problem mentioned above, an object of the present invention is to propose a GOA circuit and an LCD adopting the GOA circuit for resolving the problem happening in the conventional technology.

According to the present invention, a gate driver on array (GOA) circuit comprises a plurality of GOA circuit units. The plurality of GOA circuit units are coupled and cascade-connected. Each stage GOA circuit unit outputs a scanning signal from an output terminal according to a scanning signal, a first clock signal, and a second clock signal output by a two-stage ahead GOA circuit unit. Each stage GOA circuit unit comprises an input control module, an output control module, a holding module, a voltage regulating module, a pull-up module, a pull-down keep module, and a driving module. The input control module is used for conducting when the scanning signal output by the two-stage ahead GOA circuit unit is received. The holding module, electrically connected to the input control module and a first control node, is used for holding a voltage level of the first control node. The holding module comprises a first transistor, a second transistor, and a third transistor. The first transistor comprises a first control terminal electrically connected to the input control module, a first input terminal electrically connected to a first constant voltage, and a first output terminal electrically connected to the first control node. The second transistor comprises a second control terminal electrically connected to the driving signal, a second input terminal electrically connected to the first output terminal of the first transistor, and a second output terminal electrically connected to the first control node. The third transistor comprises a third control terminal and a third output terminal electrically connected to the first control node and a third input terminal electrically connected to the input control module. The output control module, electrically connected to the first control node, is used for controlling the output scanning signal based on voltage imposed on the first control node. The voltage regulating module, electrically connected to the holding module, is used for preventing electricity leakage. The pull-up module, electrically connected to the second control node, is used for keeping the second control node at high voltage level when the second clock signal is received. The pull-down keep module is electrically connected to the input control module, the holding module, the output control module, the pull-up module, and the voltage regulating module. The pull-down keep module is used for keeping the second control node at low voltage level during a non-scan period and for keeping the output scanning signal at low voltage level. The driving module, electrically connected to the output terminal and the second transistor, is used for outputting the driving signal for turning up the second transistor when a pulse of the output scanning signal is output.

In one aspect of the present invention, the voltage regulating module comprises a fourth transistor, and the fourth transistor comprises a fourth control electrode electrically connected to the first constant voltage, a fourth input electrode electrically connected to the first control electrode of the first transistor, and a fourth output electrode electrically connected to the second control node.

In another aspect of the present invention, the pull-up module comprises a fifth transistor, and the fifth transistor comprises a fifth control electrode electrically connected to the second clock signal, a fifth input electrode electrically connected to the first constant voltage, and a fifth output electrode electrically connected to the second control node.

In another aspect of the present invention, the pull-down keep module comprises: a sixth transistor, comprising a sixth control electrode electrically connected to the second clock signal, a sixth input electrode electrically connected to the fourth output electrode of the fourth transistor, and a sixth output electrode electrically connected to the second constant voltage; a seventh transistor, comprising a seventh control electrode electrically connected to the fourth output electrode of the fourth transistor, a seventh input electrode electrically connected to the second control node, and a seventh output electrode electrically connected to the second constant voltage; an eighth transistor, comprising an eighth control electrode electrically connected to the second control node, an eighth input electrode electrically connected to the first control node, and an eighth output electrode electrically connected to the second constant voltage; a ninth transistor, comprising a ninth control electrode electrically connected to the second control node, a ninth input electrode electrically connected to the output terminal, and a ninth output electrode electrically connected to the second constant voltage; and a first capacitor, comprising two terminals electrically connected to the second control node and the second constant voltage.

In another aspect of the present invention, the input control module comprises a tenth transistor, and the tenth transistor comprises a tenth control electrode and a tenth input electrode electrically connected to the scanning signal output by the two-stage ahead GOA circuit unit and a tenth output electrode electrically connected to the first control electrode of the first transistor.

In another aspect of the present invention, the output control module comprises an eleventh transistor, and the eleventh transistor comprises an eleventh control electrode electrically connected to the first control node, an eleventh input electrode electrically connected to the first clock signal, and an eleventh output electrode electrically connected to the output terminal.

In another aspect of the present invention, the driving circuit is an inverter, for inverting the scanning signal from the output terminal for outputting the driving signal.

In another aspect of the present invention, the driving circuit is an NOR gate circuit and is electrically connected to the output terminal and the second control node, for performing NOR operation for outputting the driving signal based on the scanning signal and voltage imposed on the second control node.

In another aspect of the present invention, the driving circuit comprises: a twelfth transistor comprising a twelfth control electrode and a twelfth input electrode electrically connected to the first constant voltage and a twelfth output electrode electrically connected to the second control electrode of the second transistor; and a thirteenth transistor, comprising a thirteenth control electrode electrically connected to the output terminal, a thirteenth input electrode electrically connected to the second control electrode of the second transistor, and a thirteenth output electrode electrically connected to the second constant voltage.

In still another aspect of the present invention, the driving circuit further comprises: a fourteenth transistor comprising a fourteenth control electrode electrically connected to the second control node, a fourteenth input terminal electrically connected to the second control electrode of the second transistor, and a fourteenth output electrode electrically connected to the second constant voltage.

In yet another aspect of the present invention, the GOA circuit further comprises: a second capacitor, comprising two terminals electrically connected to the first control node and the output terminal.

According to the present invention, a display comprises a source driver for outputting data signal to a plurality of pixel units to display grey levels, and a GOA circuit as disclosed above.

Compared with the conventional technology, a holding module is substituted for a capacitor in a GOA circuit unit proposed by the present invention. A second transistor in the holding module is turned on when a scanning signal does not produce a pulse so that voltage imposed in a first control node is held by a first transistor and a third transistor. Because the transistors form a direct current passage between the first control node and a first constant voltage, the voltage imposed on the first control node does not vary due to electricity leakage. Because a second capacitor is coupled with the voltage imposed on the first control node, the pulse of the scanning signal output by the GOA circuit unit reaches to an ideal high voltage level. Besides, the voltage imposed on the second control node forces an eighth transistor to be turned on in a non-scan period, and then an output control module is pulled down and closed because of the voltage imposed on the first control node. So the scanning signal output by the GOA circuit unit is at low voltage level. In conclusion, the GOA circuit unit proposed by the present invention can resolve the problem of easy leakage of electricity, which frequently happens in the conventional GOA circuit unit comprising the capacitor. When the scanning signals are output by the GOA circuit unit proposed by the present invention, the stability is highly ensured.

These and other features, aspects and advantages of the present disclosure will become understood with reference to the following description, appended claims and accompanying figures.

DETAILED DESCRIPTION OF THE PREFERRED EMBODIMENTS

Figure 1:
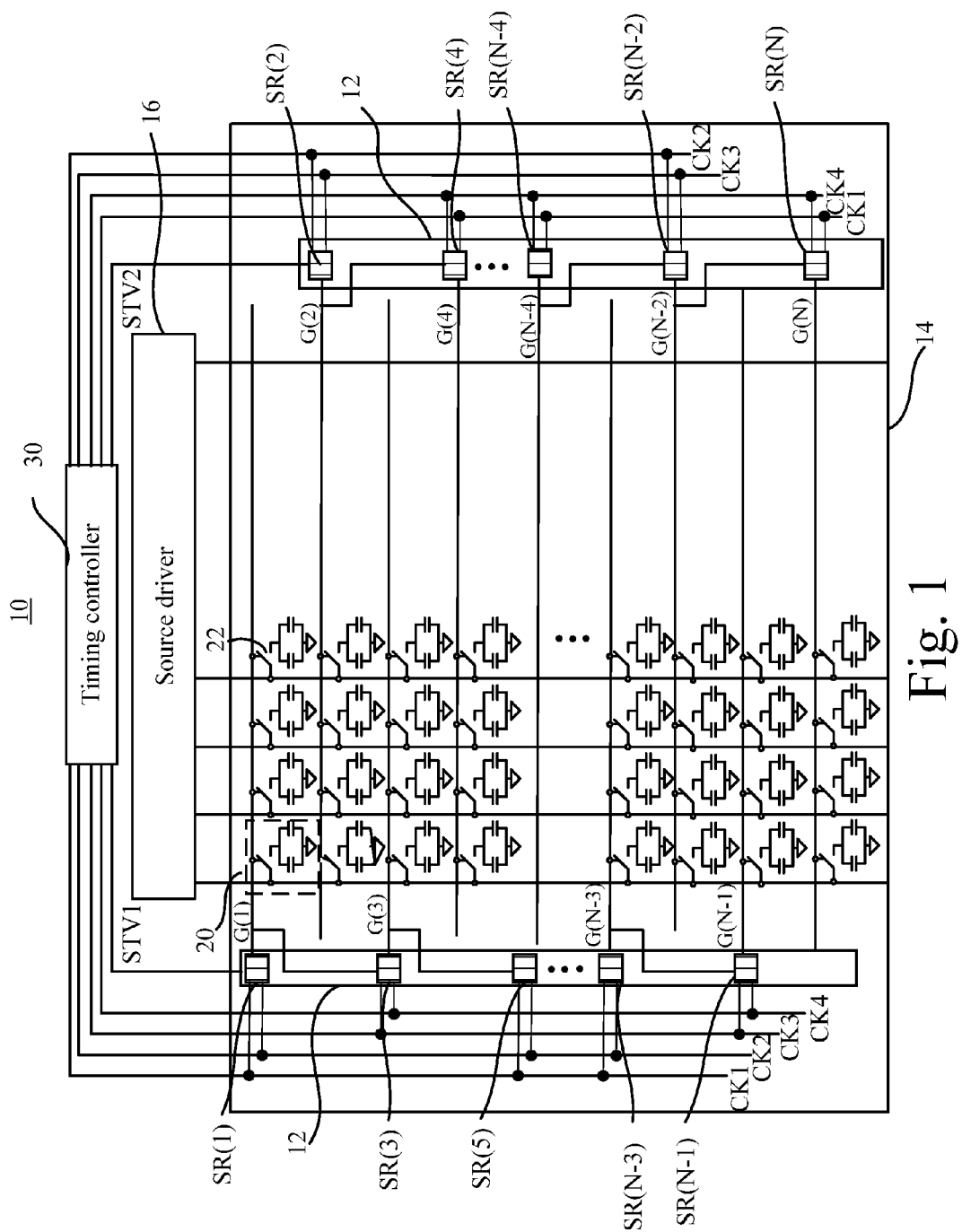
FIG. 1 is a functional block diagram of an LCD according a preferred embodiment of the present invention.

Please refer to FIG. 1. FIG. 1 is a functional block diagram of an LCD 10 according a preferred embodiment of the present invention. The LCD 10 comprises a glass substrate 14, a timing controller 30, and a source driver 16. A plurality of pixels arranged in a matrix and a plurality of GOA circuits 12 arranged in matrices are arranged on the glass substrate 14. Each of the plurality of pixels comprises three pixel units 20, which represent three primary colors, that is, red (R), green (G), and blue (B). The timing controller 30 is used for generating clock signals CK1-CK4 and commencing signals STV1 and STV2. Each of the plurality of GOA circuits 12 outputs a scanning signal at regular intervals for turning on transistors 22 on each row in order. Meanwhile, the source driver 16 outputs a corresponding data signal to all of the pixel units 20 on one column so that all of the pixel units 20 on the column can be fully charged for showing diverse grayscales. When all of the pixel units 20 on the same row are fully charged, the signal for the row is turned off by the GOA circuit 12. Then, the GOA circuit 12 outputs a scanning signal to turn on the transistors 22 on the next row. The source driver 16 charges and discharges the transistors 22 on the next row. According to the step, all of the pixel units 20 are fully charged in the end. Subsequently, the pixel units 20 on the first row are charged again. Take the LCD 10 with resolution of 1024× 768 and a refresh frequency of 60 Hz for example. 1024× 768×3 pixel units 20 are required. The show time of each image is about 1/60=16.67 ms. The GOA circuit 12 as shown in FIG. 1 comprises N GOA circuit units SR(1), ... , SR(N) where N indicates 768.

Figure 2:
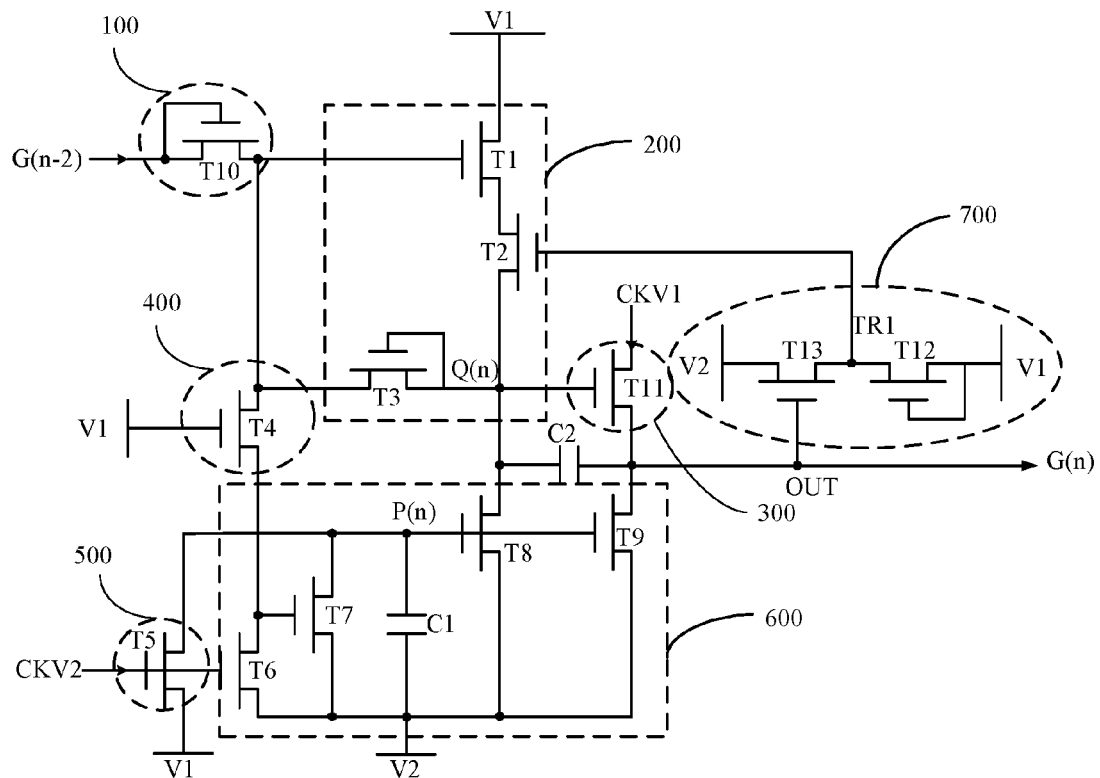
FIG. 2 is a circuit diagram of a GOA circuit unit according to a first embodiment of the present invention.

Please refer to FIG. 1 and FIG. 2. FIG. 2 is a circuit diagram of a GOA circuit unit SR(n) according to a first embodiment of the present invention. To narrow down the non-display sections at both sides (i.e., the sections of the glass substrate 14 where the GOA circuits 12 are arranged), the GOA circuits 12 are arranged on two sides of the glass substrate 14. The GOA circuit 12 comprises a plurality of cascade-connected GOA circuit units SR(n). Preferably, two GOA circuits 12 comprises GOA circuit units SR(1), SR(3), ..., SR (767) generating odd scanning signals G(1), G(3), ..., G(767) and GOA circuit units SR(2), SR(4), ..., SR (768) generating even scanning signals G(2), G(4), ..., G(768), respectively. When receiving the commencing signal STV1, the GOA circuit unit SR(1) generates a scanning signal G(1) according to the clock signals CK1 and CK2. When receiving the commencing signal STV2, the GOA circuit unit SR(2) generates a scanning signal G(2) according to the clock signals CK2 and CK3. In the following, each stage GOA circuit unit SR(n) outputs a scanning signal G(n) from the output terminal OUT according to a scanning signal G(n–2), a first clock signal CKV1, and a second clock signal CKV2 output by a two-stage ahead GOA circuit unit SR(n–2). The clock signal CKV1 and the second clock signal CKV2 represents two of the four clock signals CK1-CK4. The clock signals CK1-CK4 produce pulses alternatively, and the produced pulses never overlap temporally. Specifically, the GOA circuit units SR(1), SR(3), ..., SR (N–3) generate the scanning signals G(1), G(5), ..., G(N–3) according to the clock signals CK1 and CK2 (i.e., the first clock signal CKV1 and the second clock signal CKV2 as shown in FIG. 2). Also, the GOA circuit units SR(2), SR(6), ..., SR (N–2) generate the scanning signals G(2), G(6), ..., G(N–2) according to the clock signals CK2 and CK3 (i.e., the first clock signal CKV1 and the second clock signal CKV2 as shown in FIG. 2). Also, the GOA circuit units SR(3), SR(7), ..., SR (N–1) generate the scanning signals G(3), G(7), ..., G(N–1) according to the clock signals CK3 and CK4 (i.e., the first clock signal CKV1 and the second clock signal CKV2 as shown in FIG. 2). Also, the GOA circuit units SR(4), SR(8), ..., SR (N) generate the scanning signals G(4), G(8), ..., G(N) according to the clock signals CK4 and CK1 (i.e., the first clock signal CKV1 and the second clock signal CKV2 as shown in FIG. 2).

Each stage GOA circuit unit SR(n) comprises an input control module 100, a holding module 200, an output control module 300, a voltage regulating module 400, a pull-up module 500, a pull-down keep module 600, and a driving module 700. The input control module 100 is used for conducting when receiving the scanning signal G(n–2) output by the two-stage ahead GOA circuit unit SR(n–2). The holding module 200 is electrically connected to the input control module 100 and a first control node Q(n) and used for holding the voltage level of the first control node Q(n). The output control module 300 is electrically connected to the first control node Q(n) and used for controlling the output scanning signal G(n) based on the voltage imposed on the first control node Q(n). The voltage regulating module 400 is electrically connected to the holding module 200 and used for preventing electricity leakage. The pull-up module 500 is electrically connected to the second control node P(n) and used for keeping the second control node P(n) at high voltage level when receiving the second clock signal CKV2. The pull-down keep module 600 is electrically connected to the input control module 100, the holding module 200, the output control module 300, the pull-up module 500, and the voltage regulating module 400 and used for keeping the second control node P(n) at low voltage level during a non-scan period and keeping the output scanning signal G(n) at low voltage level. The driving module 700 is electrically connected to the output terminal OUT and the second transistor T2 and used for outputting a driving signal TR1 for turning up the second transistor T2 when the pulse of the output scanning signal G(n) is output.

The holding module 200 comprises a first transistor T1, a second transistor T2, and a third transistor T3. The first transistor T1 comprises a first control terminal electrically connected to the input control module 100, a first input terminal electrically connected to a first constant voltage V1, and a first output terminal electrically connected to the first control node Q(n). The second transistor T2 comprises a second control terminal electrically connected to the driving signal TR1, a second input terminal electrically connected to the first output terminal of the first transistor, and a second output terminal electrically connected to the first control node Q(n). The third transistor T3 comprises a third control terminal and a third output terminal electrically connected to the first control node Q(n) and a third input terminal electrically connected to the input control module 100.

The voltage regulating module 400 comprises a fourth transistor T4. The fourth transistor T4 comprises a fourth control electrode electrically connected to the first constant voltage V1, a fourth input electrode electrically connected to a first control electrode of the first transistor T1, and a fourth output electrode electrically connected to the second control node P(n).

The pull-up module 500 comprises a fifth transistor T5. The fifth transistor T5 comprises a fifth control electrode electrically connected to the second clock signal CKV2, a fifth input electrode electrically connected to the first constant voltage V1, and a fifth output electrode electrically connected to the second control node P(n).

The pull-down keep module 600 comprises a sixth transistor T6, a seventh transistor T7, an eighth transistor T8, a ninth transistor T9, and a first capacitor C1. The sixth transistor T6 comprises a sixth control electrode electrically connected to the second clock signal CKV2, a sixth input electrode electrically connected to the fourth output electrode of the fourth transistor T4, and a sixth output electrode electrically connected to the second constant voltage V2. The seventh transistor T7 comprises a seventh control electrode electrically connected to the fourth output electrode of the fourth transistor T4, a seventh input electrode electrically connected to the second control node P(n), and a seventh output electrode electrically connected to the second constant voltage V2. The eighth transistor T8 comprises an eighth control electrode electrically connected to the second control node P(n), an eighth input electrode electrically connected to the first control node Q(n), and an eighth output electrode electrically connected to the second constant voltage V2. The ninth transistor T9 comprises a ninth control electrode electrically connected to the second control node P(n), a ninth input electrode electrically connected to the output terminal OUT, and a ninth output electrode electrically connected to the second constant voltage V2. The first capacitor C1 comprises two terminals electrically connected to the second control node P(n) and the second constant voltage V2.

The input control module 100 comprises a tenth transistor T10. The tenth transistor T10 comprises a tenth control electrode and a tenth input electrode electrically connected to the scanning signal G(n–2) output by the two-stage ahead GOA circuit unit SR(n–2) and a tenth output electrode electrically connected to the first control electrode of the first transistor T1.

The output control module 300 comprises an eleventh transistor T11. The eleventh transistor T11 comprises an eleventh control electrode electrically connected to the first control node Q(n), an eleventh input electrode electrically connected to the first clock signal CKV1, and an eleventh output electrode electrically connected to the output terminal OUT.

The driving circuit 700 is an inverter. The driving circuit 700 is used for inverting the scanning signal G(n) from the output terminal OUT for outputting the driving signal TR1. The driving circuit 700 comprises a twelfth transistor T12 and a thirteenth transistor T13. The twelfth transistor T12 comprises a twelfth control electrode and a twelfth input electrode electrically connected to the first constant voltage V1 and a twelfth output electrode electrically connected to the second control electrode of the second transistor T2. The thirteenth transistor T13 comprises a thirteenth control electrode electrically connected to the output terminal OUT, a thirteenth input electrode electrically connected to the second control electrode of the second transistor T2, and a thirteenth output electrode electrically connected to the second constant voltage V2.

The gate driving circuit SR(n) further comprises a second capacitor C2. The second capacitor C2 comprises two terminals electrically connected to the first control node Q(n) and the output terminal OUT.

All of the transistors in the GOA circuit unit SR(n) as shown in FIG. 2 are N-type metal oxide semiconductor (NMOS) transistors. Preferably, the control electrode, the input electrode, and the output electrode of each of the transistors T1-T13 are the gate, the drain, and the source of each of the transistors T1-T13, respectively. The first constant voltage V1 is at high voltage level. The second constant voltage V2 is at low voltage level. The input electrode and the output electrode of each of the transistors T1-T13 can be also the source and the drain of the transistor, respectively.

Figure 3:
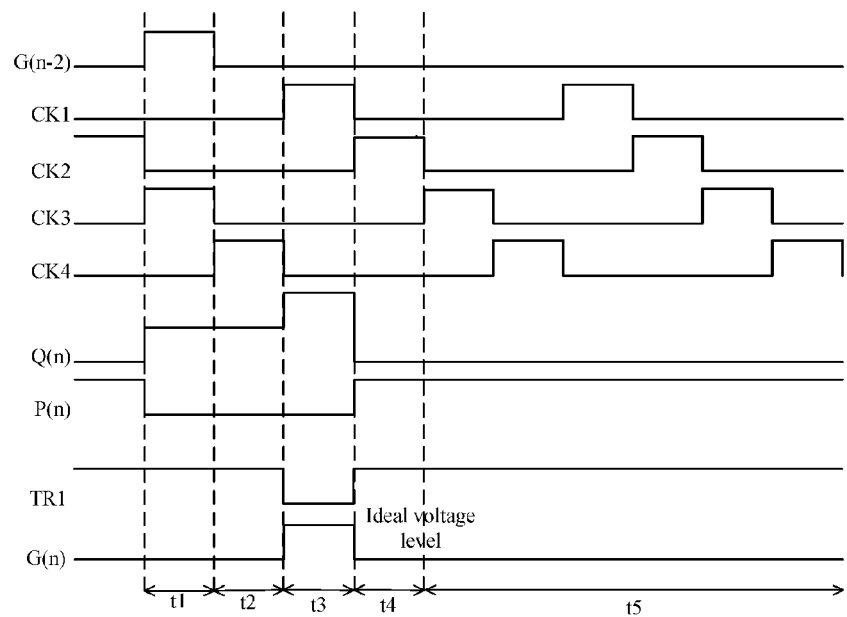
FIG. 3 is a timing diagram of various input signals, output signals, and node voltages as shown in FIG. 2.

Please refer To FIG. 3 as well. FIG. 3 is a timing diagram of various input signals, output signals, and node voltages as shown in FIG. 2. The period when each of the GOA circuit units outputs the scanning signal G(n) is called a scan period, that is, t3 shown in FIG. 3. The remaining periods are called non-scan periods. The non-scan periods are classified into a pre-charge period t1-t2 and an idle period t5. For better explanation, this embodiment details the GOA circuit unit SR(n) using the clock signals CK1 and CK2 (the first clock signal CKV1 and the second clock signal CKV2, respectively).

During the period of t1, the tenth control electrode of the tenth transistor T10 receives the scanning signal G(n−2) at high voltage level, and the tenth transistor T10 transmits the scanning signal G(n−2) at high voltage level to the first control electrode of the first transistor T1 to conduct the first transistor T1. Meanwhile, the sixth control electrode of the sixth transistor T6 receives the first constant voltage V1 at high voltage level, and the ninth control electrode of the ninth transistor T9 is conducted with the scanning signal G(n−2) at high voltage level. The ninth transistor T9 is conducted, and the second constant voltage V2 is at low voltage level is imposed on the second control node P(n). Meanwhile, the fifth transistor T5 is conducted and the first clock signal CKV1 at low voltage level is transmitted to the output terminal OUT, so the scanning signal G(n) keeps at low voltage level. Because the driving module 700 inverts the scanning signal G(n) for outputting the driving signal TR1 at high voltage level, the second transistor T2 is turned on. Both of the first transistor T1 and the second transistor T2 are turned on. The first constant voltage V1 at high voltage level is imposed on the first control node Q(n).

During the period of t2, the first transistor T1 and the ninth transistor T9 are turned off. The first transistor T1 and the third transistor T3 of the holding module 200 holds the voltage imposed on the first control node Q(n) at high voltage level. Because the first transistor T1 and the second transistor T2 form a direct current passage between the first control node Q(n) and the first constant voltage V1 at high voltage level, the voltage imposed on the first control node Q(n) is not lowered due to electricity leakage. In the meantime, the fifth transistor T5 is conducted, and the first clock CKV1 at low voltage level is transmitted to the output terminal OUT. So the scanning signal G(n) keeps at low voltage level. The scanning signal G(n) at low voltage level outputs the driving signal TR1 at high voltage level. Therefore, the second transistor T2 is turned on.

During the period of t3, the fifth control electrode of the fifth transistor T5 receives the held first control node Q(n) with the voltage at high voltage level, and the first clock signal CKV1 at high voltage level is transmitted to the output terminal OUT for forming the pulse of the scanning signal G(n). The scanning signal G(n) at high voltage level outputs the driving signal TR1 at low voltage level for turning off the second transistor T2. Thus, the second capacitor C2 is coupled with the voltage imposed on the first control node Q(n). The voltage level of the pulse of the scanning signal G(n) rises with the voltage imposed on the first control node Q(n) and reaches to an ideal high voltage level. The scanning signal G(n) outputs the driving signal TR1 at low voltage level. Therefore, the second transistor T2 is turned off.

During the period of t4, the fifth transistor T5 and the sixth T6 are turned on because of the second clock signal CKV2 at high voltage level. The first constant voltage V1 at high voltage level is transmitted to the second control node P(n). The eighth control electrode of the eighth transistor T8 and the ninth control electrode of the ninth transistor T9 are turned on because of the second control node P(n) at high voltage level so that the first control node Q(n) and the output terminal OUT are pulled down to a stably low voltage level. In the meantime, the scanning signal G(n) keeps at low voltage level. The scanning signal G(n) at low voltage level outputs the driving signal TR1 at high voltage level. Therefore, the second transistor T2 is turned on.

Figure 4:
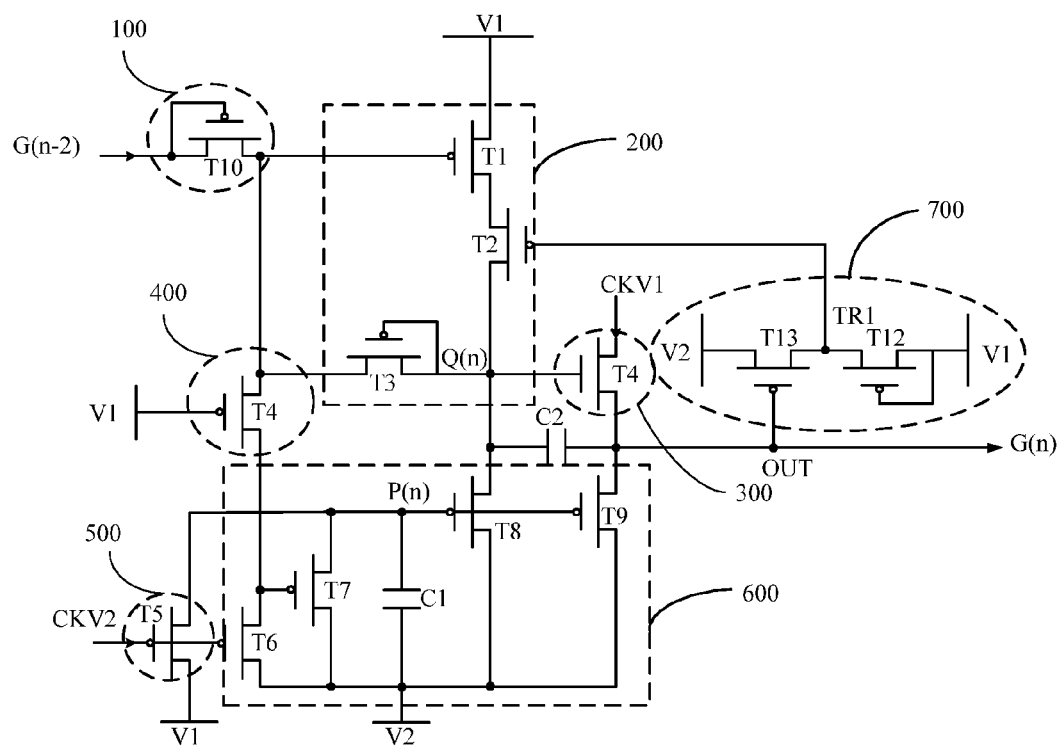
FIG. 4 is a circuit diagram of a GOA circuit unit according to a second embodiment of the present invention.
Figure 5:
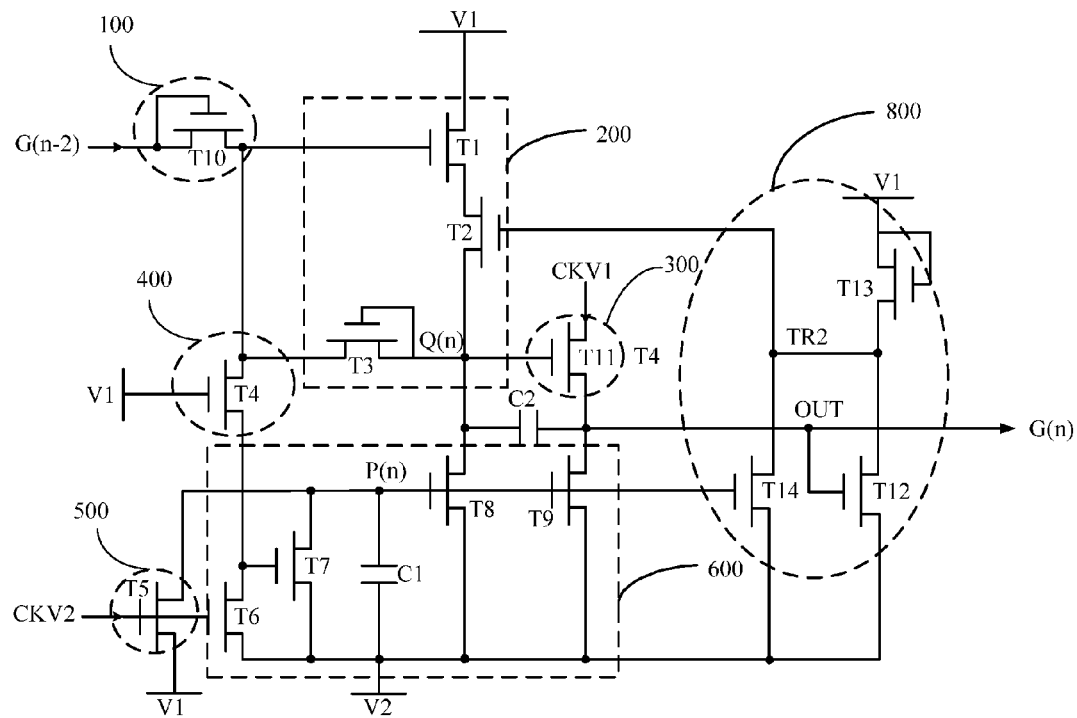
FIG. 5 is a circuit diagram of a GOA circuit unit according to a third embodiment of the present invention.

Please refer to FIG. 4. FIG. 4 is a circuit diagram of a GOA circuit unit SR(n) according to a second embodiment of the present invention. Differing from FIG. 2, all of the transistors in the GOA circuit unit SR(n) as shown in FIG. 4 are P-type metal oxide semiconductor (PMOS) transistors. The first constant voltage V1 is at low voltage level. The second constant voltage V2 is at high voltage level. The connection and operation of components as shown in FIG. 4 is the same as that as shown in FIG. 5. The voltage level used for driving a signal of the PMOS transistor and a signal output by the PMOS transistor is opposite to the NMOS transistor. It is understood by the people skilled in this field so the details will not be provided. The PMOS transistors can be substituted for some or all of the NMOS transistors based on the circuit proposed by the present invention for realizing the GOA circuit units with the same functions.

Compared with the conventional technology, a holding module 200 is substituted for a capacitor in a GOA circuit unit SR(n) proposed by the present invention. A second transistor T2 in the holding module 200 is turned on when a scanning signal does not produce a pulse so that voltage imposed in a first control node Q(n) is held by a first transistor T1 and a third transistor T3. Because the transistors T1, T2 form a direct current passage between the first control node Q(n) and a first constant voltage V1, the voltage imposed on the first control node Q(n) does not vary due to electricity leakage. Because a second capacitor C2 is coupled with the voltage imposed on the first control node Q(n), the pulse of the scanning signal G(n) output by the GOA circuit unit SR(n) reaches to an ideal high voltage level. In conclusion, the GOA circuit unit proposed by the present invention can resolve the problem of easy leakage of electricity, which frequently happens in the conventional GOA circuit unit comprising the capacitor. When the scanning signals are output by the GOA circuit unit proposed by the present invention, the stability is highly ensured.

Please refer to FIG. 5. FIG. 5 is a circuit diagram of a GOA circuit unit SR(n) according to a third embodiment of the present invention. If the GOA circuit unit SR(n) as shown in FIG. 2 and the GOA circuit unit SR(n) as shown in FIG. 5 have the same components, they are given the same labels. The components given the same labels have the same functions and operating methods. This embodiment does not detail them. Differing from the GOA circuit unit SR(n) as shown in FIG. 2, the second transistor in the GOA circuit unit SR(n) comprises the second control terminal electrically connected to the driving signal TR2, and the driving module 800 is an NOR gate circuit for performing NOR operation for outputting the driving signal TR2 based on the scanning signal G(n) and the voltage imposed on the second control node P(n). The driving module 800 comprises the twelfth transistor T12, the thirteenth transistor T13, and the fourteenth transistor T14. The twelfth transistor T12 comprises the twelfth control electrode and the twelfth input electrode electrically connected to the first constant voltage V1 and a twelfth output electrode electrically connected to the second control electrode of the second transistor T2. The thirteenth transistor T13 comprises the thirteenth control electrode electrically connected to the output terminal OUT, the thirteenth input terminal electrically connected to the second control electrode of the second transistor T2, and the thirteenth output electrode electrically connected to the second constant voltage V2. The fourteenth transistor T14 comprises a fourteenth control electrode electrically connected to the second control node P(n), a fourteenth input terminal electrically connected to the second control electrode of the second transistor T2, and a fourteenth output electrode electrically connected to the second constant voltage V2.

All of the transistors in the GOA circuit unit SR(n) as shown in FIG. 5 are NMOS transistors. Preferably, the control electrode, the input electrode, and the output electrode of each of the transistors T1-T14 are the gate, the drain, and the source of each of the transistors T1-T14, respectively. The first constant voltage V1 is at high voltage level. The second constant voltage V2 is at low voltage level. The input electrode and the output electrode of each of the transistors T1-T14 can be also the source and the drain of the transistor, respectively.

Figure 6:
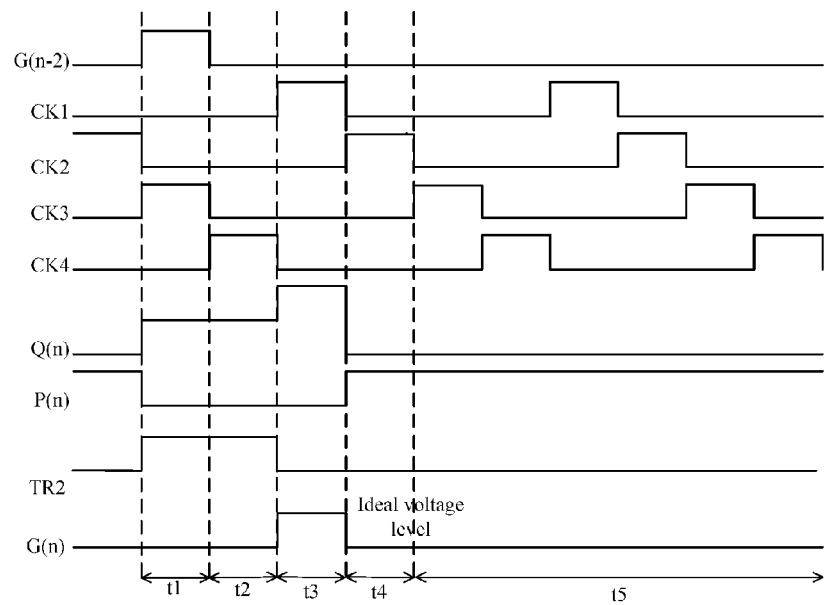
FIG. 6 is a timing diagram of various input signals, output signals, and node voltages as shown in FIG. 5.

Please refer To FIG. 6 as well. FIG. 6 is a timing diagram of various input signals, output signals, and node voltages as shown in FIG. 5. The period when each of the GOA circuit units outputs the scanning signal G(n) is called a scan period, that is, t3 shown in FIG. 6. The remaining periods are called non-scan periods. The non-scan periods are classified into a pre-charge period t1-t2 and an idle period t5. For better explanation, this embodiment details the GOA circuit unit SR(n) using the clock signals CK1 and CK2 (the first clock signal CKV1 and the second clock signal CKV2 shown in FIG. 2, respectively).

During the period of t1, the tenth control electrode of the tenth transistor T10 receives the scanning signal G(n-2) at high voltage level. The scanning signal G(n-2) is transmitted to the first control electrode of the first transistor T1 by the tenth transistor T10 for turning on the first transistor T1. Meanwhile, the sixth control electrode of the sixth transistor T6 receives the first constant voltage V1 at high voltage level, and the scanning signal G(n-2) at high voltage level is transmitted to the ninth control electrode of the ninth transistor T9. The second control node P(n) with the second constant voltage V2 at low voltage level is conducted. The first clock signal CKV1 at low voltage level is conducted and output to the output terminal OUT by the fifth transistor T5. So the scanning signal G(n) keeps at low voltage level. Because the scanning signal G(n) and the voltage imposed on the second control node P(n) are both at low voltage level, the driving module 800 performs NOR operation and outputs the driving signal TR2 at high voltage level. Therefore, the second transistor T2 is turned on. At this time, both of the first transistor T1 and the second transistor T2 are turned on. The first constant voltage V1 at high voltage level is imposed on the first control node Q(n).

During the period t2, the first transistor T1 and the ninth transistor T9 are not turned on. The first transistor T1 and the ninth transistor T9 in the holding module 200 hold the voltage imposed on the first control node at high voltage level. Because the first transistor T1 and the second transistor T2 form a direct current passage between the first control node Q(n) and the first constant voltage V1 at high voltage level, the voltage imposed on the first control node Q(n) is not lowered due to electricity leakage. In the meantime, the fifth transistor T5 is conducted, and the first clock CKV1 at low voltage level is transmitted to the output terminal OUT. So the scanning signal G(n) keeps at low voltage level. Because both of the scanning signal G(n) and the voltage imposed on the second control node P(n) are at low voltage level, the driving module 800 performs NOR operation and outputs the driving signal TR2 at high voltage level. Therefore, the second transistor T2 is turned on.

During the period of t3, the fifth control electrode of the fifth transistor T5 receives the held first control node Q(n) with the voltage at high voltage level, and the first clock signal CKV1 at high voltage level is transmitted to the output terminal OUT for forming the pulse of the scanning signal G(n). The scanning signal G(n) at high voltage level outputs the driving signal TR2 at low voltage level for turning off the second transistor T2. Thus, the second capacitor C2 is coupled with the voltage imposed on the first control node Q(n). The voltage level of the pulse of the scanning signal G(n) rises with the voltage imposed on the first control node Q(n) and reaches to an ideal high voltage level. Because the scanning signal G(n) is at high voltage level and the voltage imposed on the second control node P(n) is at low voltage level, the driving module 800 performs NOR operation and outputs the driving signal TR2 at low voltage level. Therefore, the second transistor T2 is turned off.

During the period t4, the fifth transistor T5 and the sixth transistor T6 are turned on because of the second clock signal CKV2 at high voltage level. The first constant voltage V1 at high voltage level is transmitted to the second control node P(n). The eighth control electrode of the eighth transistor T8 and the ninth control electrode of the ninth transistor T9 are turned on because of the second control node P(n) at high voltage level. So the first control node Q(n) and the output terminal OUT are pulled down to be at stably low voltage level.

During the period t4-t5, the scanning signal G(n) is at low voltage level and the voltage imposed on the second control node P(n) is at high voltage level. So the driving module 800 performs NOR operation and outputs the driving signal TR2 at low voltage level. Therefore, the second transistor T2 is turned off and is not conducted.

During the non-scan periods t1-t2 and t4-t5, the voltage imposed on the second control node P(n) forces the eighth transistor T8 and the ninth transistor T9 to be turned on. Subsequently, the output control module 300 is closed because the second constant voltage V2 is pulled down to be at low voltage level. In the meantime, the ninth transistor T9 is turned on and conducted, and the second constant voltage V2 at low voltage level is output to the output terminal OUT. So the scanning signal G(n) keeps at low voltage level.

Figure 7:
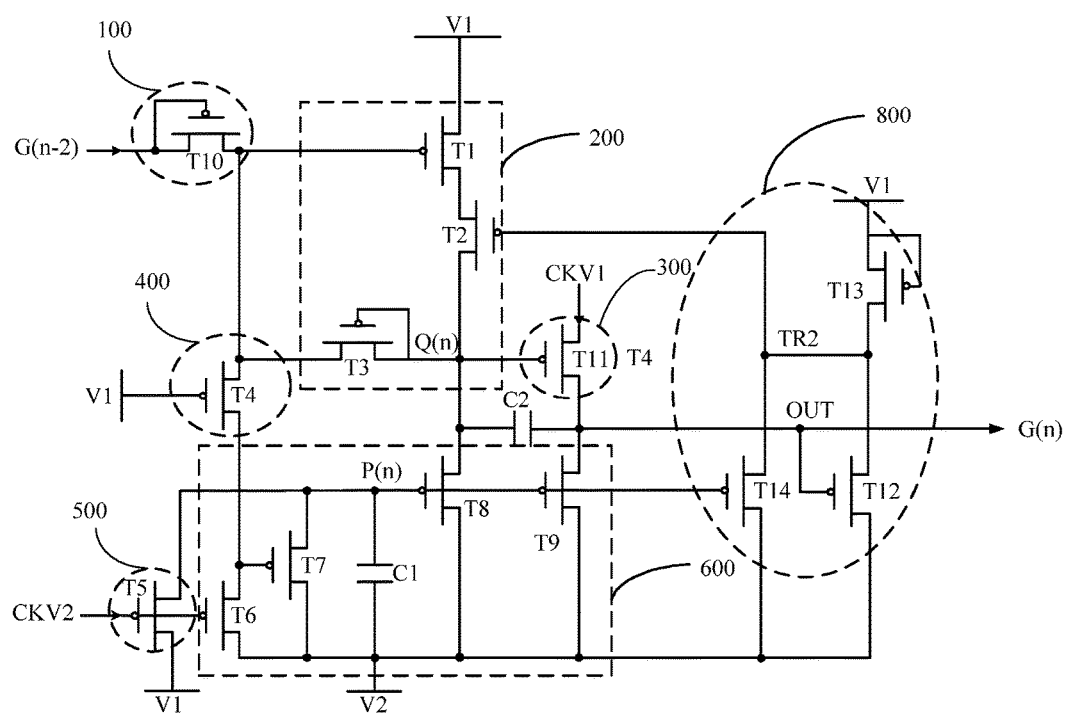
FIG. 7 is a circuit diagram of a GOA circuit unit according to a fourth embodiment of the present invention.

Please refer to FIG. 7. FIG. 7 is a circuit diagram of a GOA circuit unit SR(n) according to a fourth embodiment of the present invention. Differing from FIG. 5, all of the transistors in the GOA circuit unit SR(n) as shown in FIG. 7 are PMOS transistors. The first constant voltage V1 is at low voltage level. The second constant voltage V2 is at high voltage level. The connection and operation of components as shown in FIG. 7 is the same as that as shown in FIG. 5. The voltage level used for driving a signal of the PMOS transistor and a signal output by the PMOS transistor is opposite to the NMOS transistor. It is understood by the people skilled in this field so the details will not be provided. The PMOS transistors can be substituted for some or all of the NMOS transistors based on the circuit proposed by the present invention for realizing the GOA circuit units with the same functions.

Compared with the conventional technology, a holding module 200 is substituted for a capacitor in a GOA circuit unit SR(n) proposed by the present invention. A second transistor T2 in the holding module 200 is turned on when a scanning signal does not produce a pulse so that voltage imposed in a first control node Q(n) is held by a first transistor T1 and a third transistor T3. Because the transistors T1, T2 form a direct current passage between the first control node Q(n) and a first constant voltage V1, the voltage imposed on the first control node Q(n) does not vary due to electricity leakage. Because a second capacitor C2 is coupled with the voltage imposed on the first control node Q(n), the pulse of the scanning signal G(n) output by the GOA circuit unit SR(n) reaches to an ideal high voltage level. Besides, the voltage imposed on the second control node P(n) forces an eighth transistor T8 to be turned on in a non-scan period, and then an output control module 300 is pulled down and closed because of the voltage imposed on the first control node Q(n). So the scanning signal G(n) output by the GOA circuit unit is at low voltage level. In conclusion, the GOA circuit unit proposed by the present invention can resolve the problem of easy leakage of electricity, which frequently happens in the conventional GOA circuit unit comprising the capacitor. When the scanning signals are output by the GOA circuit unit proposed by the present invention, the stability is highly ensured.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A gate driver on array (GOA) circuit, comprising:
    a plurality of GOA circuit units, the plurality of GOA circuit units coupled and cascade-connected, each stage GOA circuit unit outputting a scanning signal from an output terminal according to a scanning signal, a first clock signal, and a second clock signal output by a two-stage ahead GOA circuit unit, and each stage GOA circuit unit comprising:
    an input control module, for conducting when the scanning signal output by the two-stage ahead GOA circuit unit is received;
    a holding module, electrically connected to the input control module and a first control node, for holding a voltage level of the first control node, comprising:
        a first transistor, comprising a first control terminal electrically connected to the input control module, a first input terminal electrically connected to a first constant voltage, and a first output terminal;
        a second transistor, comprising a second control terminal electrically connected to the driving signal, a second input terminal electrically connected to the first output terminal of the first transistor, and a second output terminal electrically connected to the first control node; and
        a third transistor, comprising a third control terminal and a third output terminal electrically connected to the first control node and a third input terminal electrically connected to the input control module;
    an output control module, electrically connected to the first control node, for controlling the output scanning signal based on voltage imposed on the first control node;
    a voltage regulating module, electrically connected to the holding module, for preventing electricity leakage;
    a pull-up module, electrically connected to a second control node, for keeping the second control node at high voltage level when the second clock signal is received;
    a pull-down keep module, electrically connected to the holding module, the output control module, the pull-up module, and the voltage regulating module, for keeping the second control node at low voltage level during a non-scan period and for keeping the output scanning signal at low voltage level; and
    a driving module, electrically connected to the output terminal and the second transistor, for outputting the driving signal for turning up the second transistor when a pulse of the output scanning signal is output.

2. The GOA circuit of claim 1, wherein the voltage regulating module comprises a fourth transistor, and the fourth transistor comprises a fourth control electrode electrically connected to the first constant voltage, a fourth input electrode electrically connected to the first control electrode of the first transistor, and a fourth output electrode electrically connected to the second control node.

3. The GOA circuit of claim 2, wherein the pull-up module comprises a fifth transistor, and the fifth transistor comprises a fifth control electrode electrically connected to the second clock signal, a fifth input electrode electrically connected to the first constant voltage, and a fifth output electrode electrically connected to the second control node.

4. The GOA circuit of claim 3, wherein the pull-down keep module comprises:
    a sixth transistor, comprising a sixth control electrode electrically connected to the second clock signal, a sixth input electrode electrically connected to the fourth output electrode of the fourth transistor, and a sixth output electrode electrically connected to the second constant voltage;
    a seventh transistor, comprising a seventh control electrode electrically connected to the fourth output electrode of the fourth transistor, a seventh input electrode electrically connected to the second control node, and a seventh output electrode electrically connected to the second constant voltage;

an eighth transistor, comprising an eighth control electrode electrically connected to the second control node, an eighth input electrode electrically connected to the first control node, and an eighth output electrode electrically connected to the second constant voltage;

a ninth transistor, comprising a ninth control electrode electrically connected to the second control node, a ninth input electrode electrically connected to the output terminal, and a ninth output electrode electrically connected to the second constant voltage; and a first capacitor, comprising two terminals electrically connected to the second control node and the second constant voltage.

5. The GOA circuit of claim 1, wherein the input control module comprises a tenth transistor, and the tenth transistor comprises a tenth control electrode and a tenth input electrode electrically connected to the scanning signal output by the two-stage ahead GOA circuit unit and a tenth output electrode electrically connected to the first control electrode of the first transistor.

6. The GOA circuit of claim 1, wherein the output control module comprises an eleventh transistor, and the eleventh transistor comprises an eleventh control electrode electrically connected to the first control node, an eleventh input electrode electrically connected to the first clock signal, and an eleventh output electrode electrically connected to the output terminal.

7. The GOA circuit of claim 1, wherein the driving circuit is an inverter, for inverting the scanning signal from the output terminal for outputting the driving signal.

8. The GOA circuit of claim 1, wherein the driving circuit is an NOR gate circuit and is electrically connected to the output terminal and the second control node, for performing NOR operation for outputting the driving signal based on the scanning signal and voltage imposed on the second control node.

9. The GOA circuit of claim 1, wherein the driving circuit comprises:

a twelfth transistor, comprising a twelfth control electrode and a twelfth input electrode electrically connected to the first constant voltage and a twelfth output electrode electrically connected to the second control electrode of the second transistor; and a thirteenth transistor, comprising a thirteenth control electrode electrically connected to the output terminal, a thirteenth input electrode electrically connected to the second control electrode of the second transistor, and a thirteenth output electrode electrically connected to the second constant voltage.

10. The GOA circuit of claim 9, wherein the driving circuit further comprises:

a fourteenth transistor, comprising a fourteenth control electrode electrically connected to the second control node, a fourteenth input terminal electrically connected to the second control electrode of the second transistor, and a fourteenth output electrode electrically connected to the second constant voltage.

11. The GOA circuit of claim 1, wherein the GOA circuit further comprises: a second capacitor, comprising two terminals electrically connected to the first control node and the output terminal.

12. A display comprising: a source driver for outputting data signal to a plurality of pixel units to display grey levels, and a GOA circuit as claimed in claim 1.

* * * * *